United States Patent
Taddei et al.

(10) Patent No.: US 9,541,837 B2
(45) Date of Patent: Jan. 10, 2017

(54) APPARATUS AND METHOD FOR REMOVING CHALLENGING POLYMER FILMS AND STRUCTURES FROM SEMICONDUCTOR WAFERS

(71) Applicant: VEECO PRECISION SURFACE PROCESSING LLC, Horsham, PA (US)

(72) Inventors: John Taddei, Breinigsville, PA (US); Laura Mauer, South Kent, CT (US); Ramey Youssef, Horsham, PA (US); John Clark, Philadelphia, PA (US); Elena Lawrence, East Norriton, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 37 days.

(21) Appl. No.: 13/922,735

(22) Filed: Jun. 20, 2013

(65) Prior Publication Data

US 2014/0377951 A1     Dec. 25, 2014

(51) Int. Cl.
*H01L 21/02* (2006.01)
*G03F 7/42* (2006.01)
*H01L 21/311* (2006.01)

(52) U.S. Cl.
CPC ......... *G03F 7/422* (2013.01); *H01L 21/02057* (2013.01); *H01L 21/31133* (2013.01)

(58) Field of Classification Search
None
See application file for complete search history.

(56) References Cited

U.S. PATENT DOCUMENTS

| | | | | |
|---|---|---|---|---|
| 4,850,381 | A * | 7/1989 | Moe et al. | 134/62 |
| 5,227,001 | A * | 7/1993 | Tamaki | H01L 21/31111 |
| | | | | 156/345.22 |
| 5,858,106 | A * | 1/1999 | Ohmi et al. | 134/1 |
| 7,655,496 | B1 * | 2/2010 | Franklin et al. | 438/72 |
| 2001/0009157 | A1 * | 7/2001 | Maekawa | H01L 21/67051 |
| | | | | 134/113 |
| 2005/0040442 | A1 * | 2/2005 | Andreas et al. | 257/253 |
| 2005/0181614 | A1 * | 8/2005 | Harchanko | H01Q 1/38 |
| | | | | 438/689 |

(Continued)

FOREIGN PATENT DOCUMENTS

EP     513967 A2 * 11/1992

*Primary Examiner* — Charles Garber
*Assistant Examiner* — Alia Sabur
(74) *Attorney, Agent, or Firm* — Leason Ellis LLP (57) ABSTRACT

The present apparatus and method are configured to remove challenging polymer films and structures from semiconductor wafers. This technique involves the use of a double soak and spray sequence with unique parameters and can be varied depending upon the application. The initial immersion step is used to initiate the swelling and dissolution of the polymer. The first spray step may include a high pressure needle to pierce through the top layer allowing more solvent to penetrate in the subsequent soak process. The second immersion can then penetrate further and faster allowing substantial penetration of the polymer by the solvent. The final high pressure spray proceeds to remove all of the polymer coating. The process ends with a final rinse and dry sequence.

20 Claims, 7 Drawing Sheets

(56) References Cited

U.S. PATENT DOCUMENTS

| | | | |
|---|---|---|---|
| 2006/0043070 A1* | 3/2006 | Moore | G03F 7/422 |
| | | | 216/83 |
| 2012/0052687 A1* | 3/2012 | Raghavan et al. | 438/705 |
| 2013/0276837 A1* | 10/2013 | Tsai | H01L 21/67051 |
| | | | 134/34 |

* cited by examiner

APPARATUS AND METHOD FOR REMOVING CHALLENGING POLYMER FILMS AND STRUCTURES FROM SEMICONDUCTOR WAFERS

TECHNICAL FIELD

The present invention generally relates to an apparatus and method for removal of polymeric materials from the surface of a semiconductor wafer, and more specifically, relates to improved methods for removing materials as part of metal lift-off, dry film resist strip, photoresist strip and high dose implant strip processes.

BACKGROUND

As technology nodes continue to decrease in critical dimensions, the number of photoresist strip steps increases along with the requirement for no material loss in the process. Photoresist is used in a variety of processes such as lift-off, thick dry films for plating, and protection for implantation to name a few. In order to withstand these process conditions, the photoresist is sometimes crosslinked and hardened to make it stable during the subsequent steps. This hardening makes it more difficult to remove with conventional techniques.

Figure 1A:
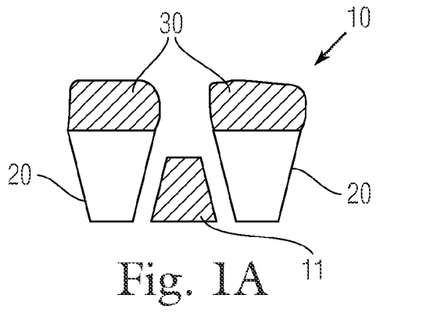
FIGS. 1A-1C are cross-sectional views showing metal lift-off structures with different sidewall angles.
Figure 1B:
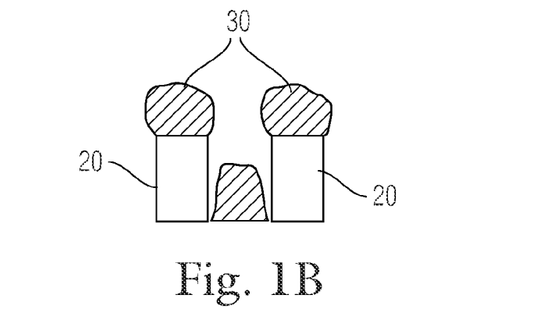
Figure 1C:
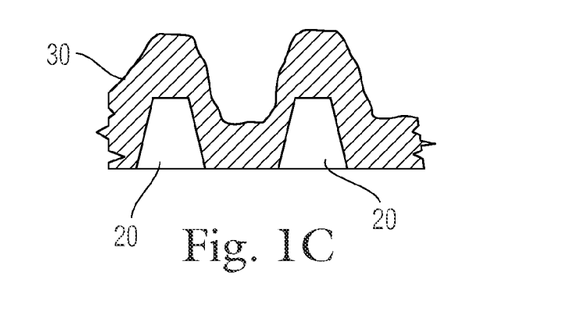

Lift-off of metal and other materials result in a complete coating being formed over the photoresist as shown in the present figures. As will be appreciated, the photoresist structure can take can number of different forms in that the photoresist can be deposited in a number of different patterns. As described herein, one lift-off technique involves immersing the wafers in a solvent bath to dissolve the patterned resist. The path for the solvent penetration can vary depending upon the sidewall angle in the lift-off structure. For examples, FIGS. 1A-C shows metal lift-off structures with different sidewall angles. FIG. 1A shows a first metal lift-off structure 10 that is formed of a lift-off polymer (patterned photoresist) 20 with metal 30 being deposited thereon. The structure also includes a metal pattern 11 that is formed on the substrate (wafer). As shown in the figures, after the photoresist cleaning process, the metal pattern 11 remains (see FIG. 2C). The lift-off polymer 20 in FIG. 1A has a sidewall structure defined by a negative angle. In FIG. 1B, the lift-off polymer 20 has a sidewall structure defined by vertical angle (i.e., the sides of the polymer 20 are vertical and parallel to one another). In FIG. 1C, the lift-off polymer 20 has a sidewall structure defined by a positive angle. It will be appreciated that the profile angle of the lift-off polymer 20 affects the shape of the deposited metal and the ease of the lift-off (with a positive angle sidewall structure (FIG. 1C) being difficult and a negative angle sidewall structure (FIG. 1A) being easier). Increasing the thickness of the lift-off polymer 20 assists in the removal of the lift-off polymer since it allows larger areas for solvent penetration. In some cases (e.g., positive angle sidewall as in FIG. 1C) there is complete coverage of the sidewall and therefore it is virtually impossible for the solvent to penetrate the lift-off polymer 20 for removal thereof.

Figure 2A:
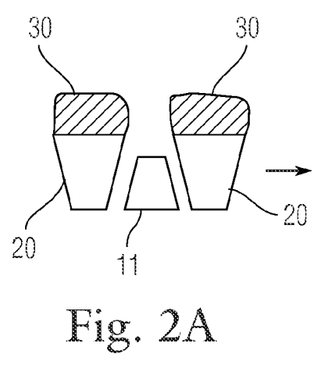
FIGS. 2A-2C are cross-sectional views showing steps of a process for solvent penetration and removal of a photoresist.
Figure 2B:
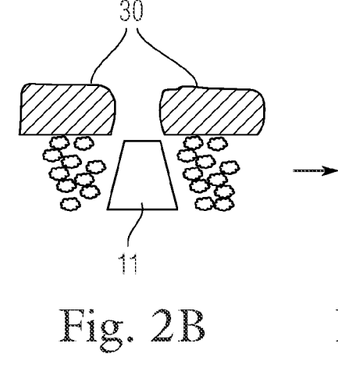
Figure 2C:
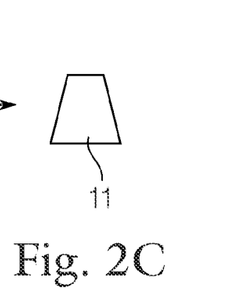

FIGS. 2A-C illustrates solvent penetration and removal of the lift-off polymer (photoresist) 20 that has a sidewall structure according to one configuration. In this case, the lift-off polymer 20 has a negative angle sidewall structure as in FIG. 1A. FIG. 2A shows solvent penetration as a result of the wafer being exposed to solvent as by immersing the wafer within a solvent bath. The solvent penetrates the underlying photoresist (lift-off polymer 20) which results in the photoresist swelling and breaking apart. The photoresist dissolves in the solvent. FIG. 2B shows that the flow of solvent removes residual photoresist and acts to "lift" the deposited metal 30 from the surface. FIG. 2C shows the intended result of the process in that a clean metal pattern remains. In other words, the metal that does not overlie the photoresist and is arranged according to a predetermine pattern remains. It will be appreciated that the force required to completely remove photoresist depends upon several factors including but not limited to: the solubility of the photoresist, thicknesses of the photoresist and metal, and lift-off structure angle.

Figure 3A:
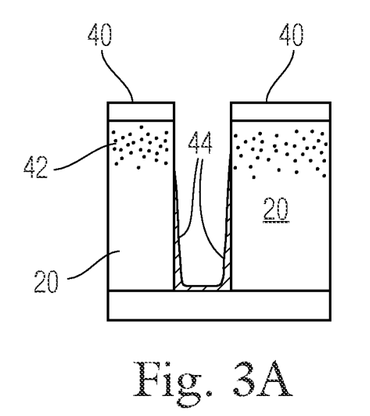
FIG. 3A is a cross-sectional view of an ion-induced carbonized layer (crust) formed on a photoresist.
Figure 3B:
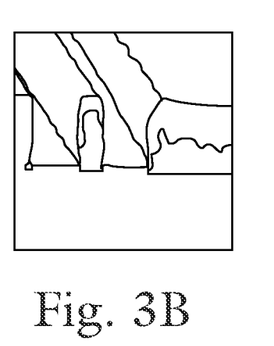
FIG. 3B is a local perspective view of a high dose implant crust formed on a photoresist.

FIGS. 3A and 3B show one challenge to the photoresist removal process and in particular, during some manufacturing processes, a crust is formed on the top and sidewalls of the photoresist 20. More specifically, implantation for doping of the silicon result in an ion-rich layer and carbonized crust formed on the top and sidewalls of the photoresist 20 (solvent-rich photoresist layer). This crust 40 makes it difficult to penetrate the soft photoresist underneath and thereby strip. In FIG. 3A, an ion-induced carbonized layer 40 is formed on the photoresist 20 and an ion-rich layer or region 42 is formed on the photoresist 20. Implant sputter residues and implant species that are formed are indicated at 44.

Figure 4A:
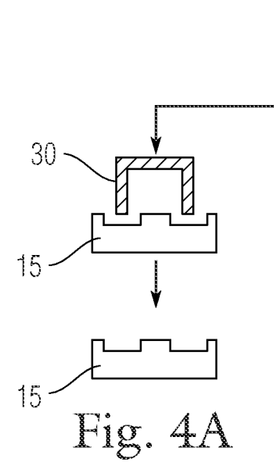
FIG. 4A is a cross-sectional view showing steps for removing a photoresist by an undercut process.
Figure 4B:
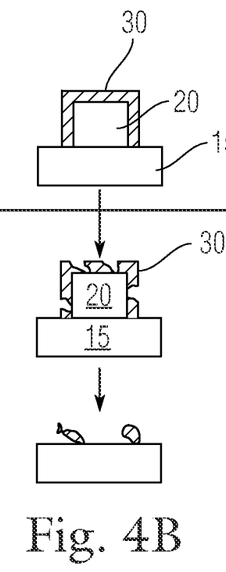
FIG. 4B is a cross-sectional view showing steps for removing a photoresist by mechanical force.
Figure 4C:
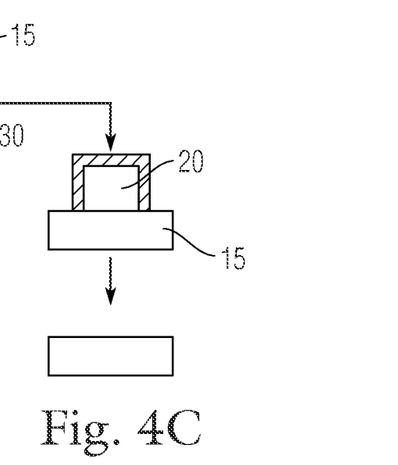
FIG. 4C is a cross-sectional view showing steps for removing a photoresist by a dissolution process.

FIGS. 4A-C depicts three conventional prior art methods for removing implanted resist. FIG. 4A depicts an undercut method for removing implanted resist 20 from a substrate (wafer) 15 (formation of the undercut facilitates removal of the resist 20); FIG. 4B depicts a method using mechanical force to remove implanted resist 20 from the substrate 15 (the mechanical force is used to penetrate (break apart) the crust layer and subsequently remove the resist 20); and FIG. 4C depicts a dissolution method for removing implanted resist 20 from the substrate 15. Unfortunately, none of these methods (techniques) are completely successful and therefore additional techniques are required in order to completely remove implanted resist 20.

Photoresist strip processes are typically a batch soak or single wafer spray process. However due to the impenetrable layer on top of the photoresist, the conventional processes, including a combination of these techniques, do not always provide complete photoresist removal.

There is therefore a need for an improved apparatus (system) and method for complete removal of the photoresist.

SUMMARY

To overcome the impenetrable layer covering the photoresist a double soak and spray sequence is introduced. Each part of this process has a unique purpose. The initial soak heats the wafer and helps to swell the underlying polymer. The high pressure spray penetrates the covering layer providing entry points for the solvent to enter. The second soak allows diffusion of the solvent into the underlying photoresist resulting in swelling and dissolution. The second high pressure spray removes the residual photoresist and pieces of the covering layer. The final process is a thorough rinsing and drying of the wafer.

BRIEF DESCRIPTION OF THE DRAWING FIGURES

FIG. 10A-10E are cross-sectional views showing steps of a double soak and spray process for a metal-lift off process;

FIG. 11A-11O are cross-sectional views showing steps of a double soak and spray process for a dry film resist strip process;

DETAILED DESCRIPTION OF CERTAIN EMBODIMENTS

In accordance with one embodiment, the present invention relates to an apparatus and method for removal of polymeric materials from the surface of a semiconductor wafer, and more specifically, relates to improved methods for metal lift-off, dry film resist strip, photoresist strip and high dose implant strip processes.

Figure 5:
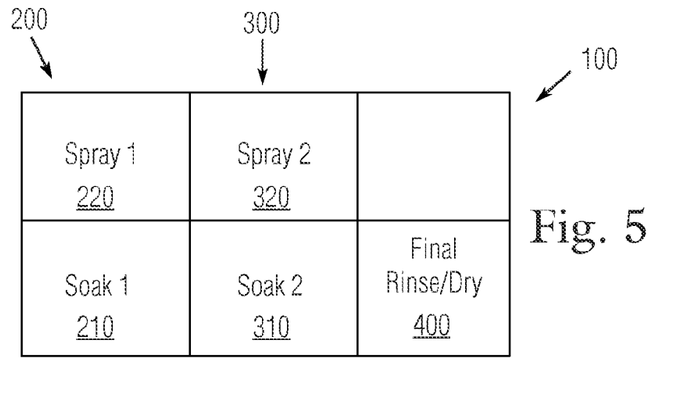
FIG. 5 is a side view of one exemplary double soak and spray system in accordance with one exemplary embodiment of the present invention.
Figure 6:
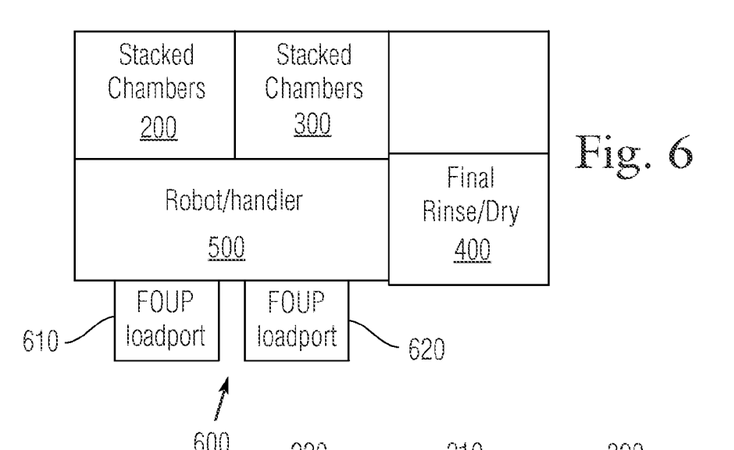
FIG. 6 is a top plan view of the system of FIG. 5.

FIGS. 5-6 illustrate an apparatus (system) 100 in accordance with one embodiment of the present invention. The system 100 is configured to remove the impenetrable layer (e.g., crust 40 of FIGS. 3A-3B or a metal lift-off layer 30) that covers the photoresist 20 and in particular, the system 100 is a dual bath and spray system. The system 100 includes a number of different components that are arranged with respect to one another to perform specific operations (steps) that are part of the method of the present invention.

The system 100 can be thought of as having two distinct stages, namely, a first stage 200 and a second stage 300. The first stage 200 is defined by a first bath 210 (first soak) that holds a volume of solvent and a first sprayer (spray device) 220 that is configured to spray a liquid, such as solvent, under pressure. Similarly, the second stage 300 is defined by a second bath 310 (first soak) that holds a volume of solvent and a second sprayer (spray device) 320 that is configured to spray a liquid, such as solvent, under pressure.

The components that are part of the first and second stages 200, 300 can be arranged in any number of different ways including the arrangement shown in FIGS. 5 and 6. More specifically, in the embodiment shown in FIGS. 5 and 6, the components (i.e., the first bath 210 and the first sprayer 220) associated with the first stage 200 are arranged in a stacked orientation and similarly, the components (i.e., the second bath 310 and the second sprayer 320) associated with the second stage 300 are arranged in a stacked orientation. As shown in FIG. 5, the first bath 210 can be disposed beneath the first sprayer 220 and similarly, the second bath 310 can be disposed beneath the second sprayer 320. The stacked components can be disposed adjacent one another as shown. The system 100 also includes a number of other components including but not limited to a final stage (final station) 400 at which the wafer undergoes final processing step(s) in that the wafer can undergo a final rinse and a drying step. The system 100 also includes a means for moving the wafer(s) between the various stations of the present system 100 to permit the wafer to undergo the various processing steps of the present method. In one embodiment, the means for moving the wafer is in the form of an automated transporter, such as a controllable robot or handler, which is generally shown at 500 as shown in FIG. 6. In addition as shown in FIG. 6, the system 100 can include one or more loading stations 600 such as a FOUP loadport that allows the wafer to be introduced into a station. In the illustrated embodiment, there are two loadports to allow continuous operation.

It will be understood that the first bath 210 includes a first solvent and the second bath 310 includes a second solvent. The first solvent and second solvents can be separate solvents or can be the same solvents. Even in the event that the same solvent is used in the baths 210, 310, the solvent used in one bath can have a different property compared to the other (e.g., the solvent can have a different concentration). Any number of different solvents can be used in the first and second baths 210, 310 so long as they are suitable for the intended use and in particular, they are suitable for dissolving the photoresist.

The baths 210, 310 thus represent containers (vessels) that hold the solvent to a desired depth. The dimensions of the baths 210, 310 can vary depending upon the application and other considerations relating to the wafers, etc. In particular, the dimensions of the baths 210, 310 are typically selected so as to allow plural wafers to be immersed within the respective bath.

The first sprayer 220 is disposed at a first spray station and similarly, the second sprayer 320 is disposed at a second spray station. The spray stations are intended to apply a force to the covered photoresist to facilitate breakup thereof. It will be appreciated that any number of different spray devices can be used at these two respective stations so long as they are suitable for the intended use. It will also be further appreciated that the first sprayer 220 can be the same as or can be different than the second sprayer 320. The sprayers 220, 320 are thus controllable devices that are fluidly connected to a source of liquid, in this case the solvent, and include a pump or the like which causes the liquid to be discharged through a nozzle or the like at high pressure. The sprayers 220, 320 can include interchangeable nozzles to allow the user to change the spray characteristics of the sprayer (e.g., high force linear spray vs. slower dispersed spray).

Figure 8:
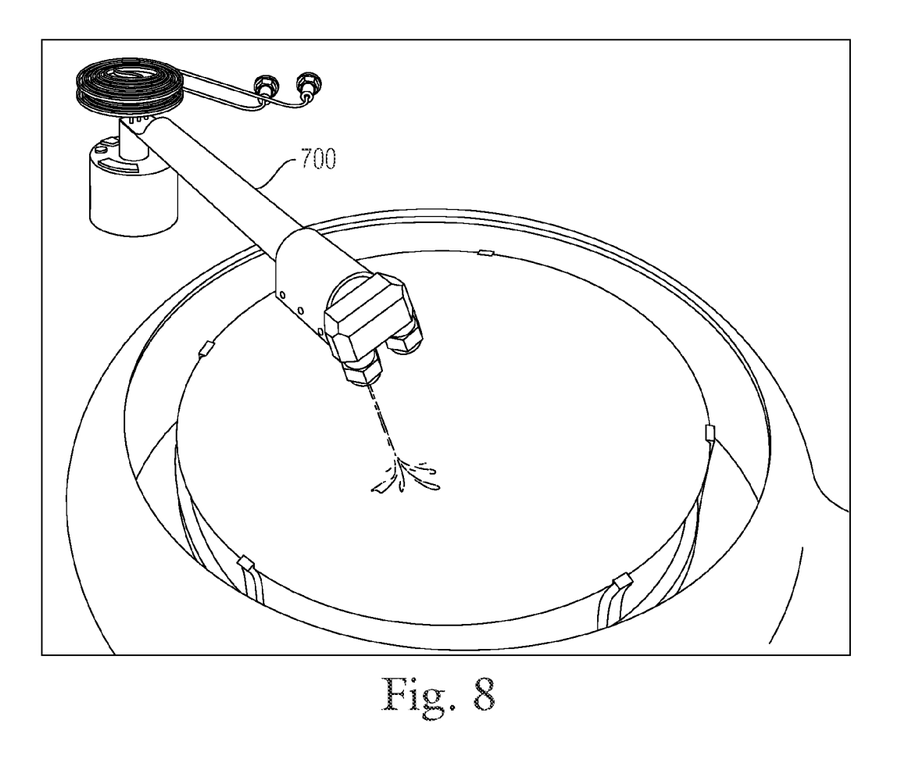
FIG. 8 is a perspective view of a sprayer in accordance with one embodiment.
Figure 9:
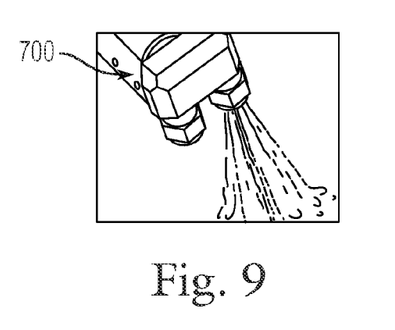
FIG. 9 is a local perspective view of a sprayer in accordance with another embodiment.

FIG. 8 shows a sprayer 700 according to one embodiment and in particular, the sprayer 700 is of a type that produces a high pressure fan spray as shown. FIG. 9 shows a sprayer 710 that is of a type that produces a high pressure needle spray. The differences between these two types of sprays relates to the coverage of the spray as well as the local velocity. As discussed herein, it will be appreciated that each of the first and second sprayers 220, 320 can be selected from one of sprayers 700, 710 or can be another type of sprayer. Moreover, the same type of sprayer can be used for both sprayers 220, 320 or the sprayers 220, 320 can be different types of sprayers.

Since the sprayers 700, 710 are operatively coupled to a controller, the operating parameters of the sprayers 700, 710 can be controlled by the user. Thus, the flow rate (velocity) of the sprayers 700, 710 can be controlled. In one embodiment, the sprayers 220, 320 operate at a pressure of less than or equal to about 3,000 psi and more particularly between 1,000 psi and 3000 psi and in one example, between about 1,500 psi and 2,500 psi.

As mentioned herein, the robot (transporter) 500 is disposed proximate to the baths 210, 310 so as to allow the robot to grasp and transport one or more wafers from one station to the next station which may be part of the same stage or may be part of the next stage.

In one embodiment, the robot 500 is of the type that includes a tray structure (not shown) to hold one or more wafers (preferably a number of wafers) as the wafers are moved from one station to another station as part of a wet transfer.

The method of the present invention can be thought of as a dual (double) soak (wafer immersion) and spray sequence that has been found to provide superior results compared to the prior art techniques. Each component of the present system 100 and each step of the present method has a unique purpose. The initial immersion (soak) of the wafer in the first bath 210 heats the wafer and helps to swell the underlying polymer (i.e., the lift-off polymer (photoresist)).

The high pressure spray generated by the first sprayer 220 penetrates the covering layer (e.g., the "crust" or metal lift-off) providing entry points for the solvent to enter.

The robot (transporter) 500 thus moves the wafer(s) between the first bath 210 and the first sprayer 220 as part of a wet transfer process in that the wafer is not allowed to dry between the steps of the present method. The wafer(s) can be placed on a support surface (substrate) that is below the sprayer and aligned with the spray discharge therefrom to allow the solvent to be sprayed directly onto the wafer structure.

After the wafer is sprayed with the first sprayer 220, the first stage is complete. As mentioned herein, the present applicants have discovered that ending the process at the end of the first stage is insufficient for a number of applications and results in less than optimal results.

As mentioned herein and in accordance with the present invention, the wafer(s) is subjected to additional soak and spray steps which yields improved results in terms of removal of lift-off material (i.e., removal of the lift-off polymer (photoresist). More specifically, after the wafer has been immersed in the first bath 210 for a predetermined period of time and subjected to the first sprayer 220 for a predetermined period of time, the wafer is then transported (moved) by the robot 500 to the second bath 310 where the wafer undergoes a second immersion in solvent that is contained within the second bath 310. After being immersed in the second bath 310 for a predetermined period of time, the wafer is then subjected to the second sprayer 320 for a predetermined period of time.

As mentioned previously, it will be appreciated that the operating characteristics and parameters of the second stage can be the same or similar or different than those associated with the first stage. Thus, the same or different solvents can be used for the first and second baths 210, 310; the immersion times in the first and second baths 210, 310 can be the same, similar or different; the first and second sprayers 220, 320 can be the same, similar or different and the time period for which the wafer is subjected to the first and second sprayers 220, 320 can be the same, similar or different.

The second soak (immersion of the wafer in the second bath 310) allows diffusion of the solvent into the underlying photoresist (layer 20) resulting in swelling and dissolution of the photoresist. The second high pressure spray (second sprayer 320) removes the residual photoresist and any remaining pieces of the covering layer (e.g., the crust and/or metal layer).

The final process is a thorough rinsing and drying of the wafer that is performed at station 400. The robot 500 is in communication with the final rinse and drying station 400 and thus, as with the previous steps, a wet transfer is performed between the second sprayer 320 and the final rinse and dry station 400. The station 400 can include conventional equipment that is designed to perform a final rinse and dry of the wafer. Thus, the station 400 can include a sprayer or the like that is designed to rinse the wafer. The sprayer can be similar to the sprayers 700, 710 or can be a different type of sprayer. The drying of the wafer after the final rinse can be performed by conventional equipment, including dryers (e.g., spin dry process), etc.

FIGS. 7A-D provide details on the stripping mechanisms for high-dose implant stripping (HDIS). In FIGS. 7A-7D, a high-dose implanted photoresist structure 800 include a photoresist layer 810 is formed on a substrate 805 (wafer) and for purpose of illustration, a crust layer 820 is formed on top of the photoresist layer 810 (e.g., the crust layer 820 is formed not only along the top and sidewalls of the photoresist layer 810). The crust layer 820 can have any number of different characteristics and is formed in the manner described hereinbefore.

Figure 7A:
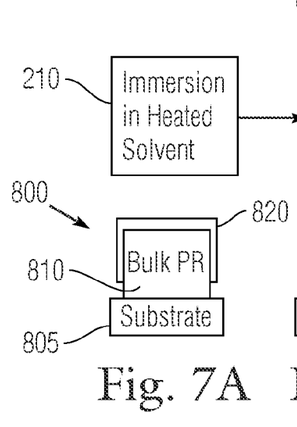
FIGS. 7A-7D are cross-sectional views showing steps of a double soak and spray process for a high dose implanted photoresist in accordance with the present invention.
Figure 7B:
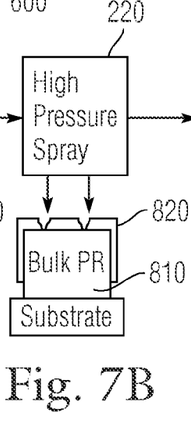
Figure 7C:
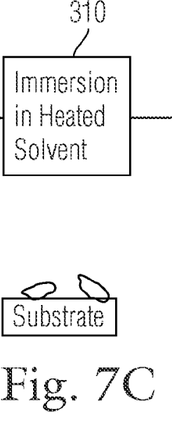
Figure 7D:
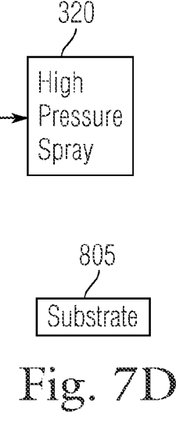

As shown in FIG. 7A, to remove the high-dose implanted photoresist 810, the first step is to heat and swell the underlying photoresist 810. This is performed by immersion of the structure 800 within the first bath 210 in which a heated solvent is present. This allows the high pressure spray to penetrate the crust in the next step of the process shown in FIG. 7B in which the structure 800 is moved from the first bath 210 to the first sprayer 220. Once the crust 820 is penetrated, the heated solvent of the second bath 310 can diffuse more readily through the polymer film (photoresist 810) underneath and dissolve it as shown in FIG. 7C. However, residual pieces of the crust 820 remain. These residual pieces of the crust layer 820 are removed by the high pressure spray (first sprayer 220) that follows, leaving the wafer surface clean as shown in FIG. 7D.

Figure 10A:
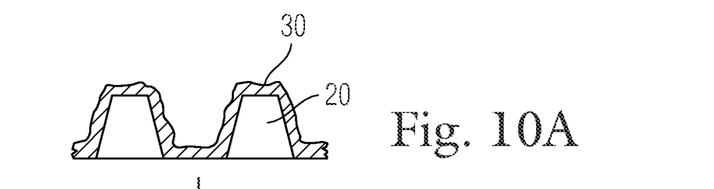

To accomplish metal (or material) lift-off on a structure that has a positive sidewall (See FIG. 1A) and therefore is completely covered with the deposited material, a similar sequence of processes is used as shown in FIGS. 10A-E. As shown in FIG. 10A, the deposited metal 30 forms a layer over the photoresist structure 20. As in the other processes, the entire structure is placed into the first bath 210 which contains a heated solvent. In one exemplary embodiments, the solvents used in accordance with the present invention are heated to within several degrees of their flash points. However, it will be appreciated that the solvents can be heated to other temperature points besides the aforementioned.

Figure 10B:
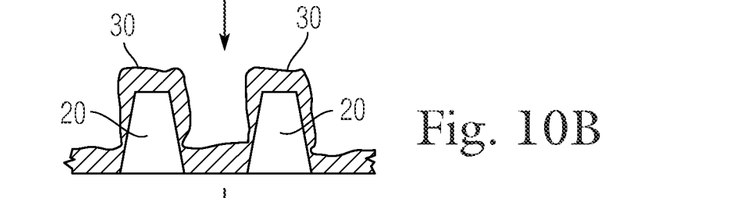
Figure 10C:
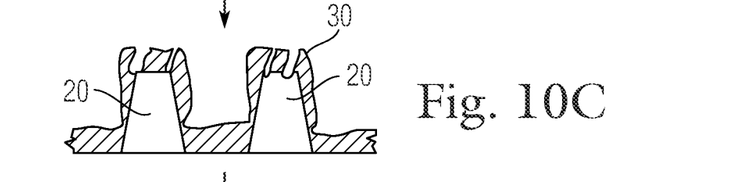

The initial immersion step in the first bath 210 provides heat to swell the underlying polymer (photoresist) 20 as shown in FIG. 10B. Once swelled, the high pressure spray generated by the first sprayer 220 can penetrate the material (photoresist 20) in places where it is weakened as shown in FIG. 10C. In effect, the high pressure spray from the first sprayer 220 causes cracks and the like to form in the metal layer 30 and in any other material deposited on the photoresist 20. This allows greater diffusion of the solvent into the polymer (photoresist 20).

Figure 10D:
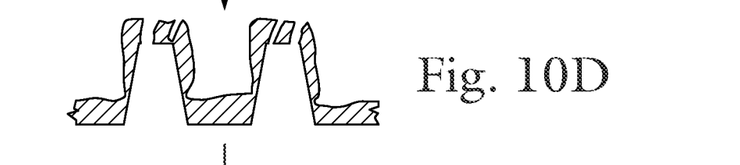

Next in accordance with the present invention, the resulting structure from the step shown in FIG. 10C is transported via robot 500 to the second bath 310 in which it undergoes additional processing. In particular and as mentioned hereinbefore, the immersion of the structure into heated solvent that is contained within the second bath 310 causes the photoresist layer 20 to dissolve as shown in FIG. 10D. As mentioned herein with respect to the teachings of the present invention, the second immersion of the structure into a heated solvent (which can be the same or different from the solvent in the first bath) allows the solvent to fully penetrate the structure and contact and dissolve the photoresist 20. As shown in FIG. 10D, the photoresist 20 has been completely removed by immersion of the wafer in the second bath 310 and the only structure which remain are metal fences (metal layers that used to surround the photoresist layer 20). Next, the structure is then transported to the second sprayer 320 which serves to remove the metal fences as shown in FIG. 10E as a result of the operation of the high pressure spray discharged from the second sprayer 320.

Figure 10E:
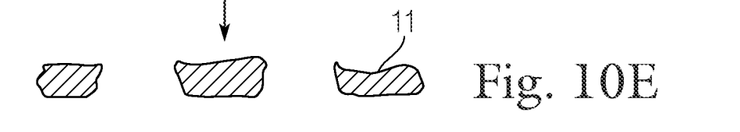
Figure 11A:
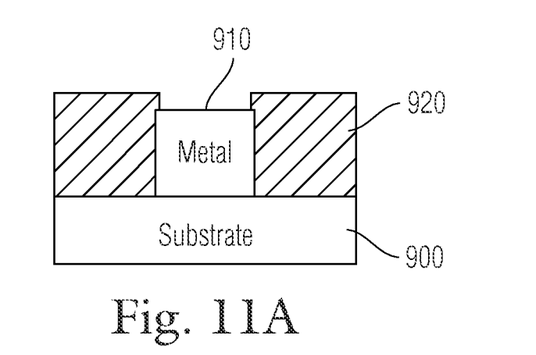

As shown in FIG. 10E, the polymer (photoresist 20) completely dissolves and can leave the metal structure intact, depending upon the conformality of the original deposition. In FIG. 10E, the metal structure that is left intact is indicated at 11. The use of the next high pressure spray (at the next spray station) can provide enough force to remove this metal structure while leaving the base metal lines intact. FIG. 10A illustrate the wafer structure after the wafer has undergone the first stage (i.e., immersion in the first bath 210 and the first spray 220). As can be seen in FIG. 10B, the metal structure of the wafer is not completely cleaned in that metal (layer 30) that that covers the photoresist 20 remains in place. Thus, the first stage cleaning does not completely remove all of the material from the wafer. FIG. 10D shows the wafer structure after it has been subjected to the second stage (i.e., the second bath 310 and the second sprayer 320). As will be appreciated, FIG. 10E shows that the metal that covered the initial photoresist material has been removed after subjecting the wafer to a second bath step and a second spray step. The base metal lines remain intact as shown in FIG. 10E The double soak/spray sequence (method) of the present invention can also be implemented for the removal of dry film resists as shown in FIGS. 11A-11C. The mechanism is different however the use of the double soak and spray sequence of the present invention is beneficial. Dry films are very thick (>50 μm) and thus are difficult to dissolve. Depending upon the composition of the dry film and the solvent chemistry, the film may swell and not completely dissolve.

Figure 11B:
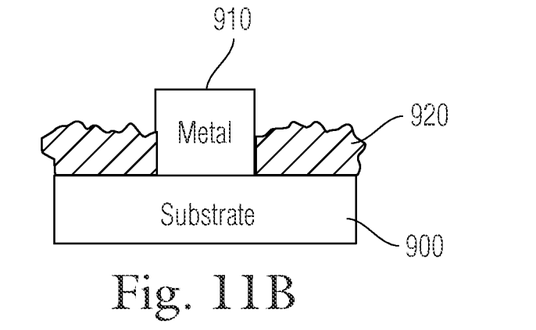

FIG. 11A shows a substrate 900 with a metal layer (structure) 910 being disposed on top of the substrate 900. A dry film resist 920 is disposed also on the substrate 900 about the metal layer 910. FIG. 11A shows the structure after a conventional plating step has been performed. FIG. 11B shows the structure after the first stage of the present method has been performed (i.e., immersion in the first bath 210 and subjected to the first sprayer 220). FIG. 11B shows that while some of the dry film resist 920 is removed, there is still some of the dry film resist 920 that remains on the substrate 900 which is not desirable since it is indicative of an incomplete cleaning process.

Figure 11C:
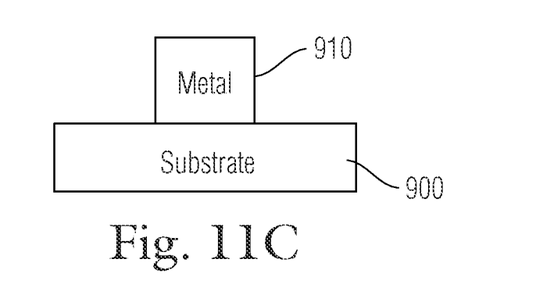

FIG. 11C shows the structure after the second stage has been performed. The dry film resist 920 has been completely removed from the substrate 900. The present Applicant discovered that the use of the double soak and spray allows sufficient time and penetration of the solvent to completely remove the thick dry film (resist) 920.

As discussed herein and with reference to FIGS. 11A and 11B, a high pressure fan spray (FIG. 8) or a high pressure needle spray (FIG. 9) can be used depending upon the materials and structure. The angle of the nozzle can also be adjusted along with the distance from the wafer surface.

As mentioned herein, the final step in the present method is to rinse and dry the wafer. This final step can include cleaning to ensure that the surface is particle free at the end of the process. As discussed above, the transfer of the wafer (using robot 500) between all process steps is done with the wafer remaining wet. The wafer is dried after the final rinse step in the last process chamber (station 400).

Figure 12:
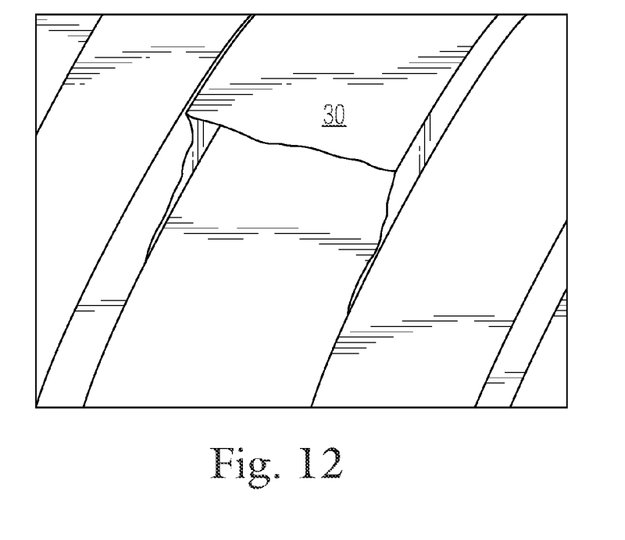
FIG. 12 is a local perspective view of a portion of a wafer after undergoing a double soak/spray process in accordance with the present invention which results in dissolution of the photoresist, while metal remains in select locations.

FIG. 12 is a local top perspective view of a portion of the wafer (substrate) after undergoing a double soak and single spray process in accordance with the teachings of the present invention. As shown in the figure, the photoresist polymer is dissolved resulting in metal remaining in select locations. For example, metal layer 30 remains covering the initial lift-off structure. As shown in FIG. 12, metal remains in place the second spray process is used to remove such metal.

Figure 13A:
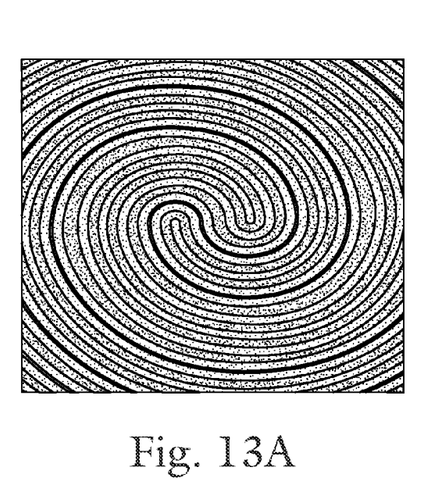
FIG. 13A is a top view of a wafer structure after undergoing a single soak/spray process.
Figure 13B:
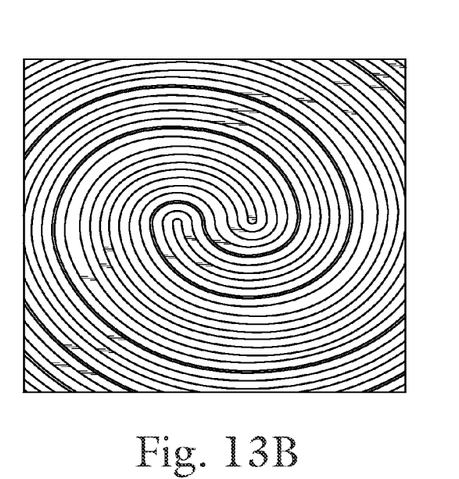
FIG. 13B is a top plan view of the wafer structure after undergoing a double soak/spray process in accordance with the present invention.

FIGS. 13A and 13B are top views of the substrate after undergoing the first stage of treatment (cleaning) and then subsequently the second stage of treatment. More particularly, FIG. 13A shows the substrate after undergoing the first stage in which the substrate (wafer) has been immersed in the first bath 210 and subjected to the first spray 220. As can be seen from FIG. 13A, the polymer structure is not completely dissolved and there is other undesirable material remaining. FIG. 13B shows the substrate after undergoing the second stage in which the substrate (wafer) has been immersed in the second bath 310 and subjected to the second spray 320. As can be seen from FIG. 13B, the polymer structure is now completely dissolved and the other undesirable material likewise has been removed, thereby resulting in a clean metal pattern remaining.

EXAMPLES

The following examples are exemplary in nature and discuss the method of the present invention. It will be appreciated to one of skill in the art that varying times, temperatures and chemistries can be employed depending upon the particular polymer being removed by the method described herein. Typically, it is more optimal if the two soak times are the same, however they do not need to be and the system configuration can change to optimize the throughput (i.e. adding additional soak chambers for the longer time, etc.).

DFR Strip Examples

Example 1

Bath 1: 30 minute soak at 50° C. in Dynastrip 7700
Spray 1: 2 minute HPC fan spray at 2000 psi and 50° C. using Dynastrip 7700
Bath 2: 30 minute soak at 50° C. in dynastrip 7700

Spray 2: 2 minute HPC fan spray at 2000 psi and 50° C. using Dynastrip 7700
IPA (isopropyl alcohol) rinse and spin dry

Example 2

Uses Same Initial Process but with a Different Chemistry at the Last Spray as a Quench Bath 1: 30 minute soak at 50° C. in Dynastrip 7700
Spray 1: 2 minute HPC fan spray at 2000 psi and 50° C. using Dynastrip 7700
Bath 2: 30 minute soak at 50° C. in dynastrip 7700
Spray 2: 2 minute HPC fan spray at 2000 psi at ambient temperature with NMP or NMP based chemical such as AZ400T
IPA rinse and spin dry

HDIS Examples

Example 1

Bath 1: 5 minute soak at 70° C. in Dynaloy DL6000
Spray 1: 1 minute HPC needle spray at 2500 psi at 70° C. in Dynaloy DL6000
Bath 2: 20 minute soak at 70° C. in Dynaloy DL6000
Spray 2: 1 minute HPC fan spray at 2500 psi at 70° C. in Dynaloy DL6000
DI water rinse and spin dry

Example 2

Bath 1: 10 minute soak at 70° C. in Dynaloy DL6000
Spray 1: 1 minute HPC fan spray at 1500 psi at 70° C. in Dyanloy DL6000
Bath 2: 10 minute soak at 70° C. in dynaloy DL6000
Spray 2: 1 minute HPC fan spray at 1500 psi at 70° C. in Dynaloy DL6000
DI water rinse and spin dry

MLO Example

Example 1

Bath 1: 30 minute soak at 89° C. in NMP
Spray 1: 1 minute HPC fan spray at 1500 psi and 89° C. in NMP
Bath 2: 30 minute soak at 89° C. in NMP
Spray 2: 1 minute HPC fan spray at 1500 psi and 89° C. in NMP
IPA rinse and spin dry While the invention has been described in connection with certain embodiments thereof, the invention is capable of being practiced in other forms and using other materials and structures. Accordingly, the invention is defined by the recitations in the claims appended hereto and equivalents thereof.

What is claimed is:

1. A method for removing photoresist that is part of a wafer and is covered by a covering layer using a double soak and spray process sequence comprising the steps of:
    immersing the wafer for a sufficient period of time in a first bath that contains a first solvent that is selected to dissolve the photoresist to cause heating of the wafer and swelling of the photoresist that underlies the covering layer;
    transferring the wafer using an automated transfer device such that the wafer is removed from the first bath and is delivered onto a first support that is part of a first spray station that is separate and spaced from the first bath;
    spraying the wafer with a first high pressure solvent for a sufficient period of time to cause penetration of the covering layer to provide fluid entry points to further dissolve the photoresist and to physically penetrate and break apart the covering layer formed on the photoresist;
    using the automated transfer device to remove the wafer from the first spray station and deliver the wafer to a second bath;
    immersing the wafer in the second bath for a sufficient period of time, the second bath containing a second solvent that is selected to dissolve the photoresist to allow diffusion of the second solvent into the photoresist that underlies the covering layer by means of the entry points resulting in further swelling and dissolution of the photoresist;
    transferring the wafer using the automated transfer device such that the wafer is removed from the second bath and is delivered onto a second support that is part of a second spray station that is separate and spaced from the second bath; and
    spraying the wafer with a second high pressure solvent for a sufficient period of time to further dissolve any remaining portions of the photoresist and remove any remaining pieces of the covering layer.

2. The method of claim 1, wherein the first and second solvents are the same.

3. The method of claim 1, wherein the first high pressure solvent is the same as the first solvent in the first bath and the second high pressure solvent is the same as the second solvent in the second bath.

4. The method of claim 1, wherein the first and second spray solvents are delivered at a pressure that is sufficient to cause at least partially penetration of the covering layer formed on the photoresist.

5. The method of claim 4, wherein the pressure is between about 1500 and 3000 psi.

6. The method of claim 1, wherein the first spray solvent is sprayed using a first sprayer that has a first spray pattern and the second spray solvent is sprayed with a second sprayer which is different than the first sprayer and has a second spray pattern different than the first spray pattern.

7. The method of claim 6, wherein one of the first and second sprayers comprises a high pressure fan sprayer and the other of the first and second sprayers comprises a high pressure needle sprayer.

8. The method of claim 1, including the step of transporting the wafer between a plurality of stations at which the wafer is subjected to the immersing and spraying steps, wherein the wafer remains wet during transportation between stations.

9. The method of claim 1, further including the steps of rinsing and drying the wafer.

10. A method of fabricating a semiconductor device comprising:
    patterning a layer of photoresist onto a surface of a wafer to define metal feature areas and residual metal areas;
    depositing a metal layer over the patterned layer of photoresist, the metal layer comprising metal feature portions in the metal feature areas and residual metal portions in the residual metal areas;

immersing the wafer for a sufficient period of time in a first bath that contains a first solvent to cause heating of the wafer and swelling of the photoresist that underlies the residual metal portions;

removing the wafer from the first bath and delivering the wafer to a first spray location that is spaced from the first bath and is distinct and separate therefrom;

spraying the wafer at the first spray location with a first high pressure solvent for a sufficient period of time to cause penetration of the residual metal portions to provide entry points for the solvent to enter to allow the layer of photoresist to dissolve and to physically remove the residual metal portions from the residual metal areas;

removing the wafer from the first spray location and delivering the wafer to a second bath that is spaced from first spray location and is distinct and separate therefrom;

immersing the wafer for a sufficient period of time in a second bath that contains a second solvent to allow diffusion of the second solvent into the underlying photoresist resulting in further swelling and dissolution;

removing the wafer from the second bath and delivering the wafer to a second spray location that is spaced from the second bath and is distinct and separate therefrom; and spraying the wafer at the second spray location for a sufficient period of time with a second high pressure solvent to further dissolve any remaining portions of the layer of photoresist and to physically remove any residual metal portions from the residual metal areas.

11. The method of claim 10, wherein the first and second solvents are the same.

12. The method of claim 10, wherein the first high pressure solvent is the same as the first solvent in the first bath and the second high pressure solvent is the same as the second solvent in the second bath.

13. The method of claim 1, wherein the first and second baths are the same and the first and second spray stations are the same.

14. The method of claim 1, wherein the first spray solvent is sprayed using a first sprayer and the second spray solvent is sprayed with a second sprayer which is different than the first sprayer.

15. The method of claim 1, wherein the photoresist has a sidewall structure defined by a negative angle.

16. The method of claim 1, wherein the photoresist has a sidewall structure defined by a vertical angle.

17. The method of claim 1, wherein the photoresist has a sidewall structure defined by a positive angle.

18. The method of claim 10, wherein the photoresist has a sidewall structure defined by a negative angle.

19. The method of claim 10, wherein the photoresist has a sidewall structure defined by a vertical angle.

20. The method of claim 10, wherein the photoresist has a sidewall structure defined by a positive angle.

* * * * *